(12) United States Patent
Foong et al.

(10) Patent No.: US 8,643,172 B2
(45) Date of Patent: Feb. 4, 2014

(54) HEAT SPREADER FOR CENTER GATE MOLDING

(75) Inventors: Chee Seng Foong, Selangor (MY);
Aminuddin Ismail, Selangor (MY);
Heng Keong Yip, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 1592 days.

(21) Appl. No.: 11/759,935

(22) Filed: Jun. 8, 2007

(65) Prior Publication Data
US 2008/0305584 A1    Dec. 11, 2008

(51) Int. Cl.
*H01L 23/34* (2006.01)
*H05K 7/20* (2006.01)

(52) U.S. Cl.
CPC ............................. *H05K 7/20445* (2013.01)
USPC ........... 257/713; 361/714; 361/715; 361/710; 361/719; 438/122

(58) Field of Classification Search
USPC ......... 361/704, 709, 710, 714, 715, 718, 719; 165/80.2, 185; 174/16.3; 257/712, 713, 257/E21.502; 438/122
See application file for complete search history.

(56) References Cited

U.S. PATENT DOCUMENTS

| | | | |
|---|---|---|---|
| 5,166,772 A | 11/1992 | Soldner et al. | |
| 5,381,042 A | 1/1995 | Lerner et al. | |
| 5,442,234 A | 8/1995 | Liang | |
| 5,596,485 A | 1/1997 | Glenn et al. | |
| 5,616,957 A * | 4/1997 | Kajihara | 257/712 |
| 5,633,529 A | 5/1997 | Otsuki | |
| 5,705,851 A | 1/1998 | Mostafazadeh | |
| 5,807,768 A | 9/1998 | Shin | |
| 5,929,514 A | 7/1999 | Yalamanchili | |
| 5,977,626 A | 11/1999 | Wang | |
| 5,982,621 A | 11/1999 | Li | |
| 6,198,163 B1 | 3/2001 | Crowley et al. | |
| 6,246,115 B1 | 6/2001 | Tang et al. | |
| 6,614,123 B2 | 9/2003 | Lee et al. | |
| 6,734,552 B2 | 5/2004 | Combs et al. | |
| 6,784,525 B2 | 8/2004 | Kuan et al. | |
| 6,853,070 B2 | 2/2005 | Khan | |
| 7,126,218 B1 | 10/2006 | Darveaux | |
| 7,141,886 B2 | 11/2006 | Dimaano, Jr. et al. | |
| 7,323,769 B2 | 1/2008 | Tan | |
| 2002/0171144 A1 | 11/2002 | Zhang | |
| 2003/0057550 A1 | 3/2003 | Zhao | |
| 2003/0179549 A1 | 9/2003 | Zhong | |
| 2004/0036172 A1 | 2/2004 | Azuma et al. | |
| 2004/0244952 A1* | 12/2004 | Houle et al. | 165/133 |
| 2005/0046015 A1* | 3/2005 | Shim et al. | 257/713 |
| 2005/0104195 A1* | 5/2005 | Yang | 257/706 |

(Continued)

FOREIGN PATENT DOCUMENTS

EP   1333491 A2   6/2003

*Primary Examiner* — Zachary M Pape
(74) *Attorney, Agent, or Firm* — Charles Bergere

(57) ABSTRACT

A heat spreader for an integrated circuit has a base portion and a top portion. The base portion is attachable to a surface of the integrated circuit, and has at least one channel extending therethrough. The top portion that is larger than the base portion such that the heat spreader is generally T-shaped in cross-section. The top portion has a hole at its center that extends from a top surface of the top portion to the at least one channel of the base portion. Mold compound is injected through the hole and out through the channels.

5 Claims, 2 Drawing Sheets

(56) References Cited

U.S. PATENT DOCUMENTS

| | | |
|---|---|---|
| 2005/0285258 A1 | 12/2005 | Chen |
| 2006/0063306 A1 | 3/2006 | Choi |
| 2006/0081978 A1 | 4/2006 | Huang |
| 2006/0087015 A1 | 4/2006 | Yuan |
| 2006/0109630 A1 | 5/2006 | Colgan |
| 2006/0125088 A1 | 6/2006 | Huang et al. |
| 2006/0125089 A1 | 6/2006 | Tatt |
| 2006/0138674 A1 | 6/2006 | Huang et al. |
| 2006/0145316 A1 | 7/2006 | Kim |
| 2006/0145320 A1 | 7/2006 | Vogt |
| 2006/0166397 A1 | 7/2006 | Lau |
| 2006/0170080 A1 | 8/2006 | Zuniga-Ortiz |
| 2006/0170094 A1 | 8/2006 | Subramanian |
| 2007/0200225 A1* | 8/2007 | Ibrahim et al. .............. 257/712 |
| 2008/0067645 A1* | 3/2008 | Foong et al. ................. 257/675 |

\* cited by examiner

US 8,643,172 B2

HEAT SPREADER FOR CENTER GATE MOLDING

BACKGROUND OF THE INVENTION

The present invention relates to the packaging of integrated circuits (ICs) and more particularly to a heat spreader for a center gate molding process used to package an IC.

Package reliability is compromised when heat generated within a semiconductor package is inadequately removed. To prevent package failure due to overheating, a number of thermal management techniques have been devised. One common thermal management technique involves the use of a heat spreader to dissipate the heat generated by an integrated circuit die. In a conventional semiconductor package with an exposed heat spreader, a heat spreader is attached to a top surface of the die. Mold compound is provided to surround the die and the heat spreader, but leave a top and/or side surfaces of the heat spreader exposed. Heat generated by the IC is from the IC through the heat spreader to outside the package.

The IC is often connected to a carrier with wires via a wirebonding process. As the functionality of the IC increases and package size decreases, the number of wires increases and at the same time the diameter of the wires and the distance between the wires decreases. These delicate and closely spaced wires are subject to forces exerted by the mold compound as it is formed around the IC, typically via injection molding. The force of the mold compound on the wires can cause some wires to contact each other. In addition, during the encapsulation (injection molding) process, a substantial clamping pressure is applied to the heat spreader to prevent flashing or bleeding of the molding compound. This clamping pressure can cause the die to crack.

In view of the foregoing, it would be desirable to have a method of making a semiconductor package that avoids wire sweep and die cracking problems.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
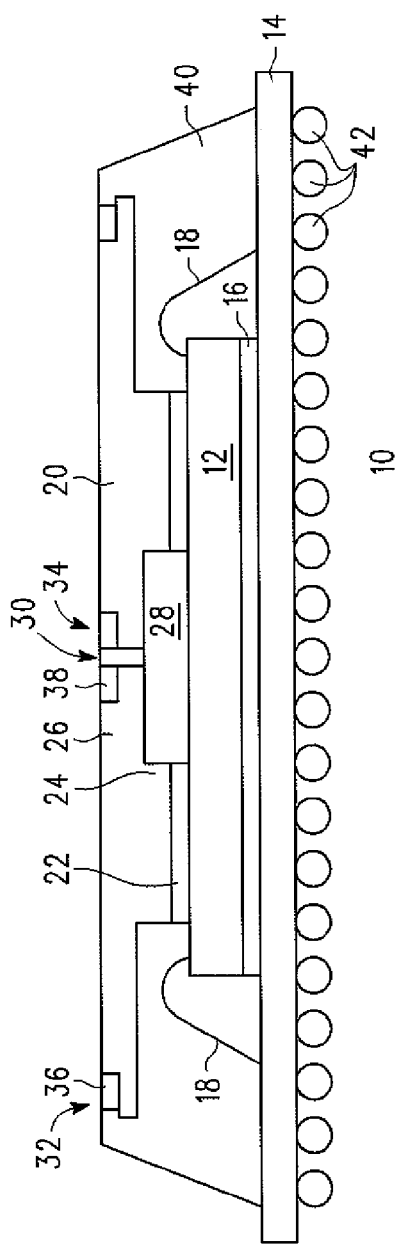
FIG. 1 is an enlarged cross-sectional view of a packaged integrated circuit with an exposed heat spreader in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a heat spreader for conducting heat produced by an integrated circuit away from the integrated circuit. The heat spreader has a base portion and a top portion. The base portion is attachable to a surface of the integrated circuit and includes at least one channel extending therethrough. The top portion, which is larger than the base portion such that the heat spreader is generally T-shaped, has a hole proximate a center thereof that extends from a top surface to the at least one channel of the base portion. During encapsulation, mold compound is injected into the hole and flows through the channels onto the IC. In one embodiment of the invention, the channels are lined up with the wires to prevent wire sweep caused by flow of the mold compound.

In another embodiment of the invention, the hole and the perimeter of the heat spreader include steps that have a layer of B-stage epoxy thereon. When the mold chase is clamped, some of the force of the mold chase exerted on the die by way of the heat spreader is dissipated.

The present invention also provides a method of packaging a semiconductor IC including the steps of attaching a die to a carrier and electrically connecting the die to the carrier such as with a wirebonding process. A generally T-shaped heat spreader is attached to a top surface of the die. The heat spreader has a hole in its top surface that communicates with channels in a base portion. The die and wires are encapsulated using a center gate molding process in which mold compound enters the hole in the heat spreader and travels through the channels onto the die to cover the die and wires.

Referring now to FIG. 1, an enlarged cross-sectional view of a packaged electronic device 10 in accordance with an embodiment of the invention is shown. The packaged device 10 includes a semiconductor IC 12 attached to a substrate or base carrier 14 with a first adhesive 16. The IC 12 is electrically connected to the carrier 14 with wires 18. As is known by those of skill in the art, the IC 12 could also be connected to the carrier 14 with bumps using a flip-chip bumping technique.

The IC 12 may be a processor such as a digital signal processor (DSP), special function circuit such as memory address generator, or a circuit that performs any other type of function. The IC 12 is not limited to a particular technology such as CMOS, or derived from any particular wafer technology. Further, the present invention can accommodate various size ICs, as will be understood by those of skill in the art. A typical example is a DSP die having a size of about 15 mm by 15 mm. The first adhesive 16 may be any suitable adhesive material, such as an adhesive tape, a thermo-plastic adhesive, an epoxy material, or the like. Such adhesives for attaching an IC die to a base carrier are well known to those of skill in the art. The wires 18 may be made of gold (Au) or other electrically conductive materials as are known in the art and commercially available.

The packaged device 10 also includes a heat spreader 20 attached to a top surface of the IC 12 with a second adhesive 22. The heat spreader 20 conducts heat generated by the IC 12 from the IC 12 to the outside of the packaged device 10. The second adhesive 22 is an adhesive material that has good heat conduction characteristics, such as, for example, silicone. The second adhesive 22 is dispensed onto the top surface of the IC 12 and then the heat spreader 20 is placed on the top surface of the IC 12 and attached by curing the conductive adhesive 22. Because the heat spreader 20 is attached to the IC 12 and not to the base carrier 14, no restrictions are imposed on the design of the base carrier 14. Therefore, existing base carriers can be used in the present invention.

The heat spreader 20 has a base portion 24 and a top portion 26. The base portion 24 is sized to attach to a surface of the integrated circuit 12. For the embodiment shown in FIG. 1, the base portion 24 is smaller than the area of the top surface of the IC 12 in order to allow space for the wires 18. Thus, for an IC that has one or more rows of bond pads (not shown) around its perimeter, the base portion is sized to fit within the area defined by the rows of bond pads. In contrast, in the embodiment shown, the top portion 26 has a greater area than that of the base portion 24 so that it has a large surface area to dissipate heat generated by the IC 12. The top portion 26 thus extends over the wires 18 towards the outer edges of the packaged device 10. As the top portion 26 is larger than the base portion 24, the heat spreader 20 is generally T-shaped in cross-section.

The base portion 24 has at least one channel 28 while the top portion 26 has a center gate opening or hole 30. The hole 30 is in communication with the at least one channel 28 such that when a mold compound is injected into the hole 30, the mold compound flows down through the top portion 26 into the channel 28 and then out the side of the base portion 24 to cover the sides of the IC 12, the wires 18 and a surface of the carrier 14. As will be understood by those of skill in the art, the base portion 24 may have more than one flow channel to allow the mold compound to be spread evenly over the surface of the carrier 14 and also so that it flows smoothly over the wires 18 and does not cause wire sweep problems.

In one embodiment, the heat spreader 20 has a first stepped down lip 32 along its perimeter. The heat spreader 20 also preferably includes a second stepped down lip 34 around the hole 30. Each of the stepped down lips 32 and 34 are preferably filled with a layer or bead of soft material such as B-stage epoxy 36 and 38, respectively. As discussed in more detail below, the stepped down lips 32 and 34 help to prevent die cracking during molding.

A mold compound 40 surrounds the IC 12, wires 18 and the top of the carrier 14. The mold compound 40 may be any known mold compound that is typically used in semiconductor packaging. The mold compound 40 is injected into the hole 30 and travels through the channels 28 onto the IC 12 and carrier 14.

The packaged device 10 also includes a plurality of solder balls 42 that allow electrical connection of the IC 12 to external devices or circuits. Thus, FIG. 1 illustrates a thermally enhanced, molded PBGA (Plastic Ball Grid Array) package. As will be understood by those of skill in the art, the heat spreader 20 may be attached to a die and formed in other package types, such a QFN (Quad Flat No lead) type package.

Figure 2:
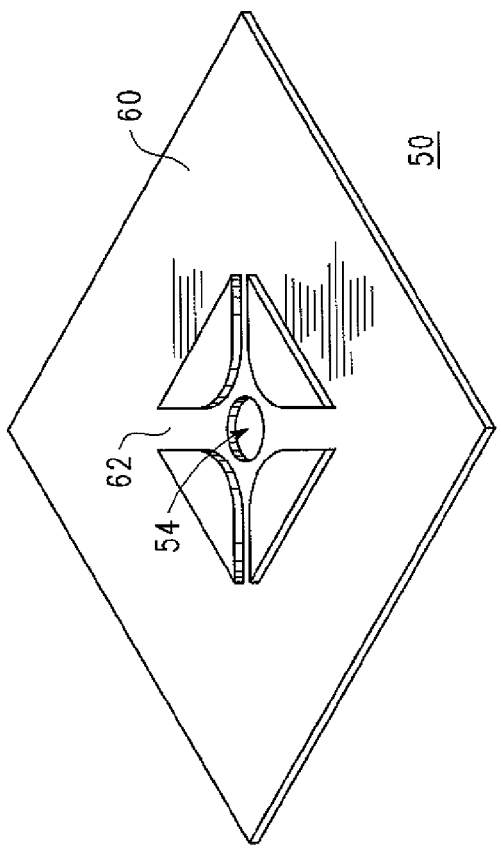
FIG. 2 is an enlarged, perspective view of a top of the heat spreader of FIG. 1.

Referring now to FIG. 2, a top perspective view of a heat spreader 50 in accordance with an embodiment of the invention is shown. The heat spreader 50 includes a top portion 52 with a hole 54 proximate to a center thereof. The hole 54 is sized to allow mold compound to flow therethrough during a center gate molding operation. A typical hole size would be about 2.5 mm in diameter for a heat spreader of 21 mm×21 mm having a height of about 0.5 mm. The heat spreader 50 includes a first stepped down lip 56 around its perimeter and a second stepped down lip 58 around the hole 54. A layer of soft material like B-stage epoxy may be formed on the first and second stepped down lips 56 and 58. The heat spreader 50 may be formed of a single sheet of thermally conductive material like copper or aluminum or alloys thereof, by cutting, punching or stamping.

Figure 3:
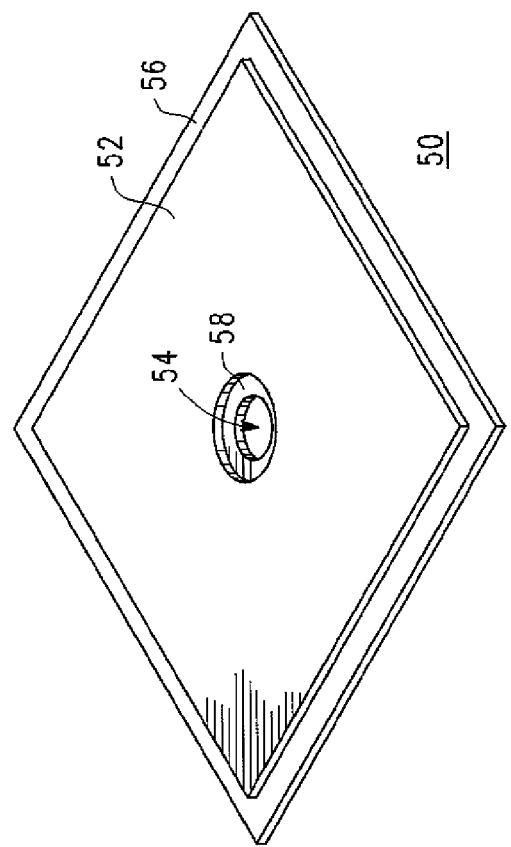
FIG. 3 is an enlarged perspective view of a bottom of the heat spreader of FIG. 1.

FIG. 3 is a bottom perspective view of the heat spreader 50 if FIG. 2. The heat spreader 50 has a bottom surface 60. The hole 54 extends from the top portion 52 through the bottom surface 60. At least one flow channel 62 (four are shown in this embodiment) is in communication with the hole 54. During a molding operation, mold compound is injected into the hole 54 from the top portion 52. The mold compound travels through the hole 54 and into the channels 62, and then exits the channels 62 and flows onto an IC die and substrate.

Figure 4:
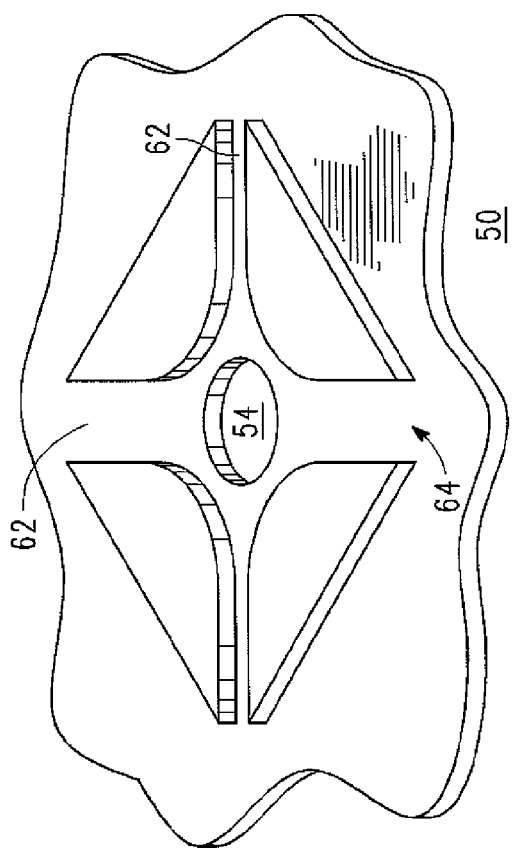
FIG. 4 is an enlarged perspective view of a portion of the heat spreader of FIG. 2.

FIG. 4 is an enlarged view of the flow channels 62 of the heat spreader 50. As can be seen, the channels 62 extend from the hole 54 outwardly to a location that corresponds with a side of a die (see FIG. 1) to which the heat spreader is attached. An exit 64 of one of the channels 62 through which the mold compound flows is shown.

Figure 5:
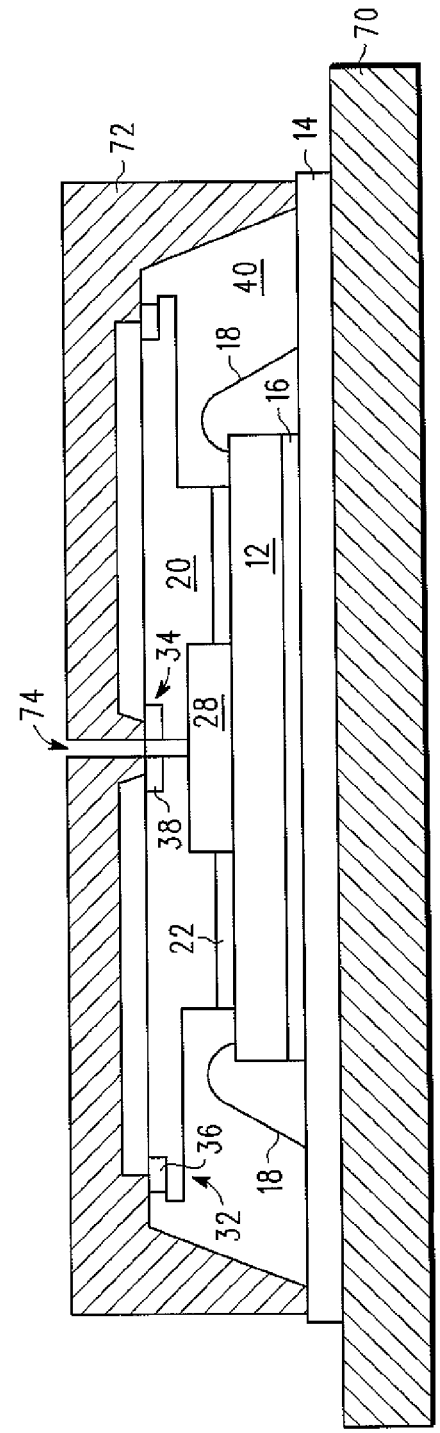
FIG. 5 is an enlarged cross-sectional view of an integrated circuit with a heat spreader in accordance with an embodiment of the present invention disposed within a mold chase.

FIG. 5 is a cross-sectional view of the packaged device 10 during a step in its formation. That is, the device is located within a mold chase. The mold chase has a bottom part 70 on which the base carrier 14 rests and a top part 72 that encompasses the device 10. The top part 72 has a hole 74 that communicates with the hole 30 in the heat spreader 20. Mold compound is 40 (see FIG. 1) is injected into the hole 74 and travels through to the hole 30 and channels 28, then onto the die 12 and carrier 14. If the channels 28 are aligned with the wires 18, wire sweeps issues can be avoided.

Note that the top part 72 of the mold contacts the heat spreader 20 at the stepped down lips 32 and 34, which are filled with B-stage epoxy 36 and 38, thus the mold top part 72 does not directly contact the heat spread 20, which eliminates die cracking due to force exerted by the mold on the die. Contact is only made on the perimeter of the heat spreader 20 via the soft layer of B-stage epoxy. During the mold clamp and before mold transfer, the B-stage epoxy will fully cure and form a hermetic seal between the heat spreader and the mold clamp, allowing the mold transfer process to occur without flashing and zero stress on the die 12. The B-stage epoxies 36 and 38 remain intact with the package as the mold chase is lifted off at the completion of the molding process.

A plurality of the packaged devices 20 may be formed simultaneously using an array processing operation, as is known in the art. A direct thermal path is provided from the IC 12 to the heat spreader 20. The heat spreader 20 is exposed at the top surface of the packaged device 10, which allows heat transfer out by convection and/or conduction. Further, because the heat spreader of the present invention is exposed to the ambient environment on the top surface, the semiconductor package of the present invention provides a substantial surface area for the convection of heat away from the semiconductor package. This enhances the thermal performance of the semiconductor packages made in accordance with the present invention. With improved thermal performance, the power capability of the semiconductor packages can be increased, for example, from about 2 Watts (W) to about 3 W. Alternatively, the temperature of the semiconductor packages can be reduced.

As is evident from the foregoing discussion, the present invention provides an inexpensive method for volume production of reliable and thermally enhanced semiconductor packages. The present invention can be implemented using current semiconductor assembly equipment. Hence, there is no need for additional capital investment. Package rigidity and reliability are enhanced with the provision of the heat spreader. The heat spreader of the present invention is simply shaped, and is therefore easy to manufacture and can be readily incorporated into the assembly process. The heat spreader 20 can be used with wire bonded MapBGA, PBGA, QFP, QFN and over-molded Flip Chip families of packages.

The heat spreader 20 can be supplied with pre-applied B-stage epoxy on the perimeter lip and lip around the center hole.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A heat spreader for conducting heat produced by an integrated circuit away from the integrated circuit, the heat spreader comprising: a base portion attachable to a surface of the integrated circuit, wherein the base portion includes at least one channel extending therethrough; and a top portion that is larger than the base portion such that the heat spreader is generally T-shaped, wherein the top portion has a hole proximate a center thereof that extends from a top surface of the top portion to the at least one channel of the base portion, and wherein a perimeter of the top surface of the top portion has a first stepped-down lip and a perimeter of the hole in the top portion includes a second stepped-down lip, wherein both the first and second stepped-down lips include a layer of B-stage epoxy therein, and wherein the at least one channel and the base portion are formed by at least two protrusions that substantially surround the hole.

2. The heat spreader of claim 1, wherein the top and base portions are formed of conductive metal.

3. The heat spreader of claim 1, wherein the at least one channel comprises at least four channels.

4. A heat spreader for conducting heat produced by an integrated circuit away from the integrated circuit, the heat spreader comprising: a base portion attachable to a surface of the integrated circuit, wherein the base portion includes at least four channels extending therethrough; and a top portion that is larger than the base portion such that the heat spreader is generally T-shaped, wherein the top portion has a hole proximate a center thereof that extends from a top surface of the top portion to the at least four channels of the base portion, and wherein the top portion further includes a first lip extending around a perimeter of the top surface, and a second lip extending around the hole at the top surface of the top portion, and wherein the first and second lips include a layer of B-stage epoxy therein, and wherein the at least four channels and the base portion are formed by four protrusions that substantially surround the hole.

5. A method of packaging a semiconductor integrated circuit (IC), comprising:
   attaching a bottom surface of the IC to a base carrier;
   electrically connecting the IC to the base carrier;
   attaching a generally T-shaped heat spreader to a top surface of the IC, wherein the heat spreader includes a top portion having a top surface, the top surface having a first lip extending around a perimeter thereof, and a hole in a center of the top surface, and at least one channel extending through a base portion of the heat spreader, wherein the channel communicates with the hole, and a second lip extending around the hole at the top surface of the top portion, and wherein the first and second lips each include a layer of soft material;
   placing the carrier, IC and heat spreader into a mold chase, wherein the mold chase contacts the layers of soft material in the first and second lips, the layers of soft material absorbing at least a portion of a pressure force on the IC and the heat spreader from the mold chase;
   injecting a mold compound into the hole, wherein the mold compound passes through the hole and into the at least one channel and out of the heat spreader such that the mold compound covers the carrier and the IC, thereby forming a packaged device; and
   removing the packaged device from the mold chase.

\* \* \* \* \*